United States Patent [19]
Leighton

[11] Patent Number: 6,036,099
[45] Date of Patent: Mar. 14, 2000

[54] HOT LAMINATION PROCESS FOR THE MANUFACTURE OF A COMBINATION CONTACT/CONTACTLESS SMART CARD AND PRODUCT RESULTING THEREFROM

[76] Inventor: Keith Leighton, 2817 Fulmer Rd., Lorain, Ohio 44053

[21] Appl. No.: 08/918,582

[22] Filed: Aug. 19, 1997

Related U.S. Application Data

[63] Continuation-in-part of application No. 08/727,789, Oct. 7, 1996.

[51] Int. Cl.[7] .......................... G06K 19/02; G06K 19/06; B32B 31/00; C09S 5/02
[52] U.S. Cl. .......................... 235/488; 235/492; 156/182; 156/154; 156/267; 156/311; 156/312
[58] Field of Search .................................... 235/488, 492, 235/486, 375; 360/2; 156/182, 154, 267, 311, 312

[56] References Cited

U.S. PATENT DOCUMENTS

| | | | |
|---|---|---|---|
| 3,994,225 | 11/1976 | Sitzberger | 101/426 |
| 4,450,024 | 5/1984 | Haghiri-Tehrani et al. | 156/108 |
| 4,701,236 | 10/1987 | Vieilledent . | |
| 4,792,843 | 12/1988 | Haghiri-Tehrani et al. . | |
| 4,795,898 | 1/1989 | Bernstein et al. . | |
| 4,841,134 | 6/1989 | Hida et al. | 235/488 |
| 4,980,802 | 12/1990 | Champagne et al. . | |
| 5,067,008 | 11/1991 | Yanaka et al. | 357/81 |
| 5,097,117 | 3/1992 | Champagne et al. . | |
| 5,173,840 | 12/1992 | Kodai et al. . | |
| 5,208,450 | 5/1993 | Uenishi et al. | 235/492 |
| 5,268,699 | 12/1993 | Laute et al. . | |
| 5,272,596 | 12/1993 | Honore et al. . | |
| 5,396,650 | 3/1995 | Terauchi . | |
| 5,412,192 | 5/1995 | Hoss . | |
| 5,438,750 | 8/1995 | Venambre . | |
| 5,567,362 | 10/1996 | Grun . | |
| 5,809,633 | 9/1998 | Mundigl et al. | 29/600 |

*Primary Examiner*—Donald Hajec
*Assistant Examiner*—Daniel Sherr
*Attorney, Agent, or Firm*—Oldham & Oldham Co., L.P.A.

[57] ABSTRACT

A plastic smart card, such as a card having a radio frequency identification (RFID) proximity function, including at least one electronic element embedded therein and a physical contact card function and the hot lamination process for the manufacture of this dual function smart card and other plastic cards including a micro-chip embedded therein. The process results in a card having a preferred overall thickness in the range of 0.028 inches to 0.032 inches with a surface suitable for receiving dye sublimation printing—the variation in card thickness across the surface should not exceed 0.0005 inches. A card manufactured in accordance with the present invention also complies with all industry standards and specifications. Also, the hot lamination process of the present invention results in an aesthetically pleasing card. The invention also relates to a plastic card formed in accordance with the hot lamination process of the present invention.

18 Claims, 4 Drawing Sheets

HOT LAMINATION PROCESS FOR THE MANUFACTURE OF A COMBINATION CONTACT/CONTACTLESS SMART CARD AND PRODUCT RESULTING THEREFROM

This application is a continuation-in-part of copending application Ser. No. 08/727,789 filed Oct. 7, 1996.

FIELD OF THE INVENTION

The present invention relates generally to plastic cards and the manufacture thereof by a hot lamination process, and more particularly to smart cards and the manufacture of these such that they conform to industry size and performance standards and conventions and that have a superior outer surface as compared to known smart cards such that the card may receive dye sublimation printing or the like. Even more specifically, the preferred embodiments of the present invention relate to dual function cards containing imbedded electronic elements as well as an exposed electronic contact surface.

BACKGROUND OF THE INVENTION

As the use of plastic cards for credit cards, automated teller machine (ATM) cards, identification cards, and like continues to become more widespread, the problems associated with the use of such cards correspondingly increase. Credit card fraud and identification card fraud are becoming larger problems everyday, and this fraud has introduced uncertainties into our systems of commerce and our security systems. Using easily available technology, criminals are able to manufacture credit/debit cards, ATM cards, identification cards, and the like having another's account code, identification code, or other personal information embedded in the magnetic stripe thereof. Thus, for example, criminals may steal hundreds or thousands of legitimate credit card account numbers and manufacture many additional cards bearing the stolen information. These fraudulent cards are then usable by the criminals to purchase goods and to receive cash with the legitimate card holder and the card issuer left holding the bill.

Likewise, so called debit cards are becoming increasingly popular. These cards have stored thereon a certain amount of value for which the card owner has previously paid. For example, a subway rider may purchase a card good for X fares, with one fare being deducted from the card each time the owner rides the subway. Criminals have also been able to manipulate the data stored on these cards to defraud the merchants and others.

The ease in which criminals have been able to manufacture and or manipulate known cards results from the existence of the easily altered magnetic stripe storage medium used by known cards. These magnetic stripes are easily programmed and reprogrammed using commonly available technology. Thus, there has been found a need in the plastic card industry to provide a more secure plastic card that is very difficult or impossible to fraudulently manipulate.

The likely successor to magnetic stripe cards is known as a memory or smart card. A smart card can generally be described as a card having an integrated circuit with memory that is capable of making decisions. The category of smart cards can be further divided into subcategories based on the type of memory or type of communication with an associated card reader. Types of smart cards include contact cards (cards requiring physical touch between the terminal reader and the surface of the card) and contactless cards (cards which interact with the terminal reader using a electromagnetic coupling). Contactless cards may also be referred to as "proximity" cards. This technology may serve as a substitute for or be provided as an addition to the magnetic stripe on a card.

One specific type of smart card is a dual function contact/contactless microprocessor chip plastic card commonly referred to in the industry as a dual function card. This card utilizes a single micropressor to control both physical contact and proximity features of the card.

While these smart cards have been found to have infinitely more capability than magnetic stripe cards as well as being more successful in preventing or limiting fraud, they are more difficult and expensive to manufacture relative to ordinary magnetic stripe cards. One of the biggest obstacles to the wide spread manufacture and use of smart cards has been the inability of card manufacturers to manufacturer a smart card that meets all industry standards and specifications, such as those set by the International Standards Organization (ISO), that are sufficiently aesthetically pleasing (wherein the embedded electronics are hidden from view), and that have a sufficiently regular or flat surface such that one or both surfaces of the card may be printed on using the very popular and widespread dye sublimation technology.

Limitations to known plastic cards with embedded computer chips and electronics are that they a) are too thick to work in connection with existing card reading machinery (ATM machines, telephones, b) have a surface that is too irregular to properly and consistently receive dye sublimation printing, c) utilize manufacturing processes making the cards cost prohibitive. Moreover, prior attempts to manufacture a sufficiently thin plastic card including a computer chip embedded therein have resulted in a card with inferior aesthetic qualities such as the ability to see the embedded computer chip through the plastic.

Furthermore, due to the presence of both internal and surface electronics within the card, the manufacture of a dual function card presents its own unique set of obstacles and problems, different from the manufacture of cards with fully embedded electronics.

SUMMARY OF THE INVENTION

The present invention is therefore directed to a hot lamination method for the manufacture of a plastic card having at least one electronic element embedded therein as well as at least one electronic element with an exposed contact surface and to such plastic cards. The card has an overall thickness in the range of 0.028 inches to 0.032 inches and comprises a plastic core having at least one electronic element embedded therein with at least one of the upper and lower surfaces of the core comprising a coating printed or otherwise applied thereon. A portion of the card's outer surface exposes a contact surface electronic element operatively connected to the card's internal electronics. An overlaminate film is preferably provided over the coated surface of the core and the resulting card has a variation in thickness across the surfaces thereof of no greater than approximately 0.0005 inches.

The hot lamination method of the present invention comprises the steps of providing upper (first) and lower (second) plastic core sheets, positioning at least one electronic element between the first and second core sheets to thus form a core, and placing the core in a laminator and closing the laminator with minimal or no laminator ram pressure applied to the core. A heat cycle is applied to the core sheets in the laminator to cause complete or partial flow of the plastic sheets. The laminator ram pressure is then increased in combination with the heat. A cooling cycle is then applied to the core in the laminator, preferably with an associated increase in ram pressure, and the core is removed from the laminator.

In the preferred embodiment, the laminated core next undergoes a controlled depth milling operation to expose one or more contact pads which comprise part of the internal, embedded electronic element.

In alternative embodiments, one of the plastic sheets contained a pre-formed window which is positioned over the contact pads, prior to lamination. A spacer, integral to the corresponding platen or separate therefrom, is utilized to prevent or limit the flow of plastic into the window region so as not to coat the contact pads with plastic during the card manufacturing process.

At least one surface of the core is then printed on using a printing press or similar printing apparatus, a sheet of overlaminate film is placed on at least one side of the core, and the core is once again placed in a laminator. A heat cycle is applied to the core with its overlaminate film, and a cooling cycle is thereafter applied, resulting in a sheet of plastic card stock from which one or more cards may be cut.

Contact surface elements are installed into the window region of a plastic card and in operable contact with contact pads.

The invention is also directed to a card manufactured in accordance with the above process which results in a plastic card having a thickness in the range of approximately 0.028 inches to 0.032 inches with a surface smoothness of at least approximately 0.0005 inches as is required by International Standards Organization (ISO) and American National Standards Institute (ANSI) standards.

The present invention provides numerous advantages over known plastic cards and known plastic card manufacturing processes, and includes the formation of a plastic card with electronic elements such as a computer chip embedded therein with a pleasing aesthetic appearance, having a sufficiently smooth and regular surface such that the card may receive dye sublimation printing, and possessing sufficient durability and characteristics to comply with all industry specifications and standards.

DETAILED DESCRIPTION OF THE INVENTION

The present invention relates to a plastic card including at least one electronic element embedded therein. The present invention also relates to a hot lamination process for the manufacture of plastic cards, and more particularly to a hot lamination process for the manufacturer of plastic cards that include an electronic element, such as a computer chip or other electronic element embedded therein. The electronic element may perform a wide variety of functions and take a wide variety of forms. Such cards, without regard to the particular electronic element embedded therein, will hereinafter be referred to as smart cards. The present invention also relates to a card formed in accordance with the invention.

Figure 1:
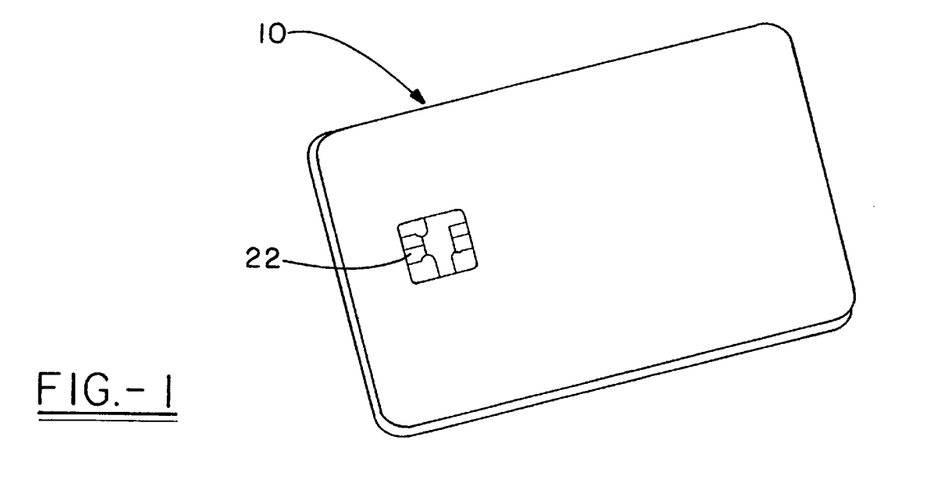
FIG. 1 is a perspective view of a plastic card in accordance with the present invention.
Figure 2:
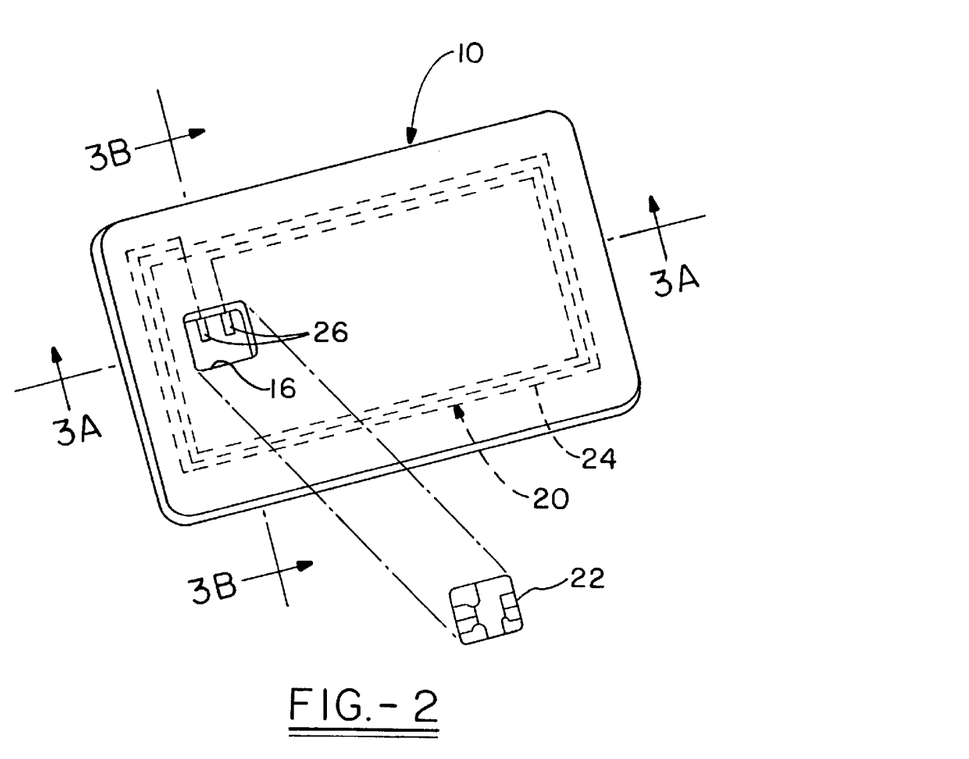
FIG. 2 is a perspective view of the card shown in FIG. 1, illustrating the embedded and exposed electronics incorporated into the card.

In its preferred embodiment and as illustrated in FIGS. 1 and 2, the present invention relates to the manufacture of a dual function card, a particular type of smart card which utilizes a dual function contact/contactless microprocessor chip, as described previously herein. However, it will be appreciated by those skilled in the art, that the method of hot lamination described herein could easily be applied to other identity card or smart card applications.

Figure 2A:
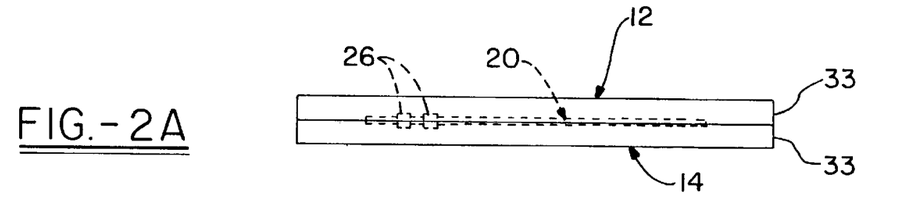
FIG. 2A is a side elevational view of the card core illustrating various electronic elements that may be embedded in a card in accordance with the present invention.
Figure 3A:
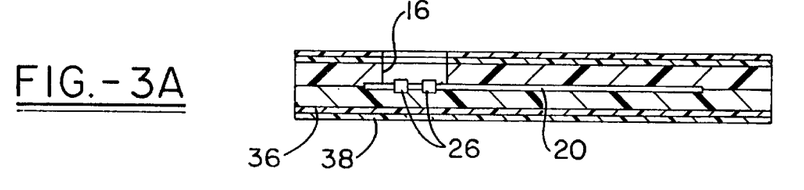
FIG. 3A is a cross sectional view of the card illustrated in FIG. 2, taken through section line 3A—3A.
Figure 3B:
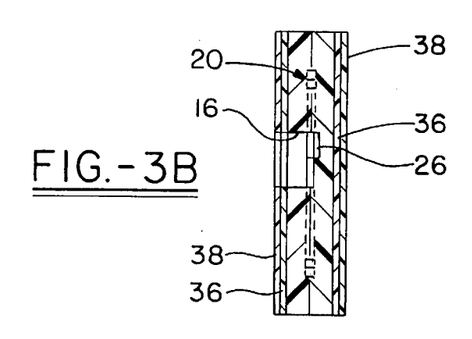
FIG. 3B is a cross sectional view of the card illustrated in FIG. 2, taken through section line 3B—3B.

Referring now to FIGS. 1, 2, and 2A there can be seen a plastic card 10 manufactured in accordance with the present invention and including an electronic element, generally 20, embedded therein. Card 10 includes an upper surface 12 and a lower surface 14. Electronic element 20 may take a wide variety of forms (microprocessor chip, circuit board, transponder, etc.) and perform a wide variety of functions. As shown in FIGS. 2, 2A, and 3A, , electronic element 20 may comprise a read/write micro-chip 22 including a wire antenna 24 connected thereto, any other suitable electronic element. These electronic elements 20, 22 and 24 and their insertion into plastic cards is not new, however, the present invention provides a new hot lamination process for manufacturing plastic cards 10 with these electronic elements embedded therein such that the cards 10 are of a superior quality, meet all ISO and other industry specifications and standards, and are sufficiently smooth and otherwise is capable of receiving dye sublimation printing. Electronic elements such as these described are available from manufacturers such as Motorola and Philips Electronics.

Upper surface 12 contains a window or cavity 16 formed therein and intended to expose one or more contact pads 26 operatively connected to antenna 24. Upon formation of card 10 in accordance with the preferred embodiment, a microprocessor chip 22 is inserted into window 16 and in electrical connection with contact pads 26. This microprocessor chip may function as a "proximity" or radio frequency identification (RFID) card in conjunction with antenna 24 when electromagnetically used with a compatible terminal reader. Microprocessor chip 22 is also capable of function as a contact card, requiring physical contact between a compatible terminal reader and the surface of chip 22. It should be appreciated that the contact function of the card may be accomplished by any contact sensor whether integral to or physically separate from chip 22 and that window 16 may be formed anywhere on surfaces 12 and/or 14 as will accomplish the purposes of the invention.

Specifically, a card in accordance with the present invention has a thickness of approximately in the range of 0.028 inches to 0.032 inches with a surface smoothness of 0.0005 inches. In order to meet the ISO standards for such cards, these tolerances apply to the surface of the microprocessor chip 22 surface as well as to the surface of plastic portion of card 10. It is to be appreciated that cards having a thickness greater than 0.032 inches can easily be manufactured in accordance with the teachings herein while meeting all of the other criteria of the present invention. However, the foreseen product demand is for cards meeting the aforementioned standards.

Figure 4:
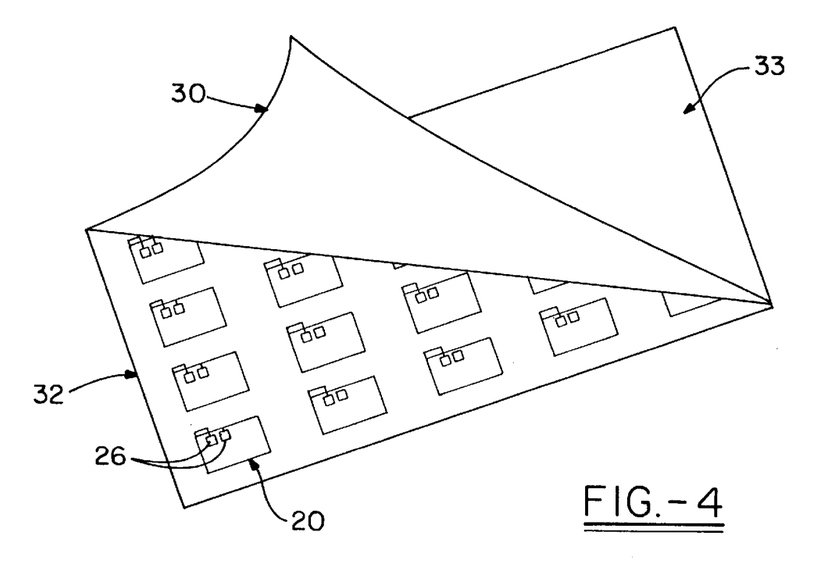
FIG. 4 is a perspective view of a plurality of electronic elements positioned on a sheet of plastic core stock and covered by a second sheet of plastic core stock.

As shown in FIG. 4, one or more cards 10 in accordance with the present invention may be manufactured by positioning an electronic element 20, including contact points 26, between first and second sheets of card stock 30, 32 to form a core 33. Preferably as shown, a plurality of cards are manufactured simultaneously, and accordingly a plurality of electronic elements 20 are positioned between the first and second sheets of plastic core stock 30, 32. When a plurality of electronic elements 20 are positioned between first and second sheets plastic core stock 30, 32, electronic elements 20 are property positioned relative to one another such that a plurality cards may be cut from the resulting card stock.

Plastic core sheets 30, 32 may be provided by a wide variety of plastics, the preferred being polyvinyl chloride (PVC) having a thickness in the range of 0.007 inches to 0.024 inches and preferably having a thickness of approximately 0.0125 inches each. Those skilled in the art will recognize that the thickness of the plastic core sheets will depend somewhat upon the thickness of the one or more electronic elements that are to be embedded therebetween if ISO standards are intended to be met. Other suitable plastics that may be utilized include polyester, acrylonitrile-butadiene-styrene (ABS), and any other suitable plastic.

Figures 5, 5A:
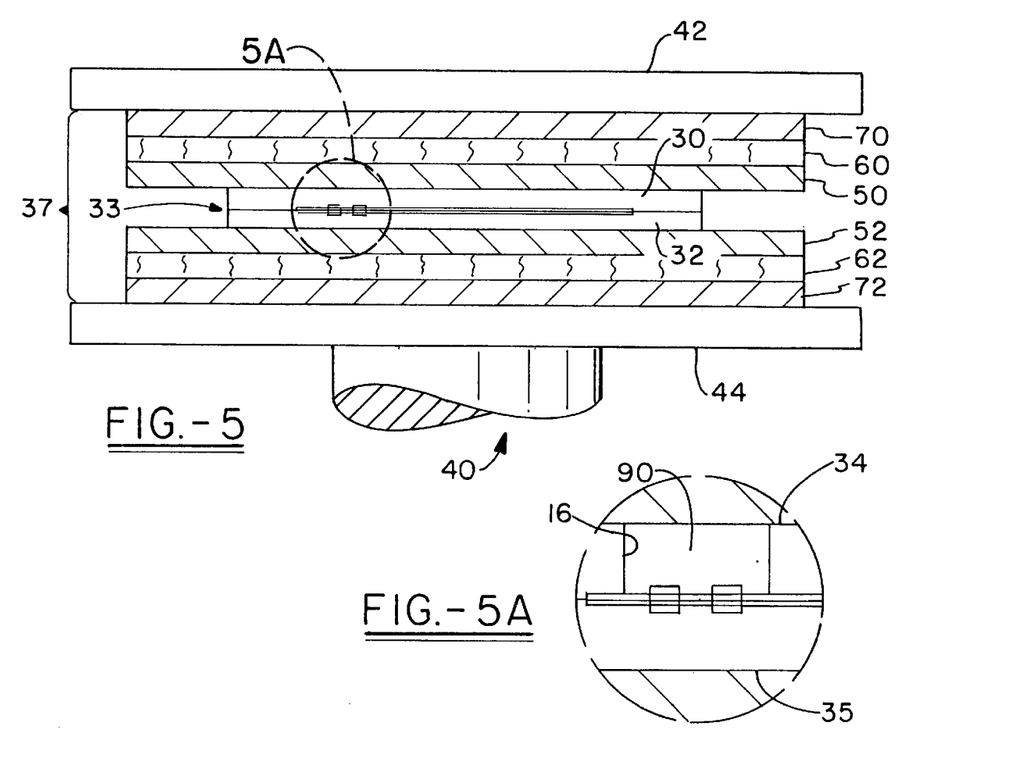
FIG. 5 is a schematic cross sectional view illustrating a book comprising the core, containing electronics, as positioned in a laminator.
FIG. 5A is an enlarged cross-sectional view of the portion encircled in FIG. 5 for an alternative embodiment, utilizing a spacer, for producing a card according to the present invention.

Subsequent to placing one or more electronic elements 20 between the first and second sheets 30, 32 of plastic core stock to form a core 33, this core 33 is placed in a laminator apparatus 40 of the type well known in the art of plastic card manufacturing. As is shown in FIG. 5, laminator 40 includes upper and lower platens 42,44 for applying ram pressure to an article positioned therebetween. In addition to the ability to apply ram pressure, laminator 40 is preferably of the type having controlled platens 42,44 that may provide both heat and chill cycles and preferably includes cycle timer to regulate cycle time. Core 33 is positioned between first and second laminating plates 50, 52, one of which is preferably matte finished to provide laminated core 33 with at least one textured outer surface. First and second laminating pads 60, 62 are positioned outside of the laminating plates 50, 52, and first and second steel plates 70, 72 are likewise positioned outside of pads of 60, 62 and the entire assembly forms a book 35 for being positioned in laminator 40 between platens 42, 44.

Once book 35 is positioned in laminator 40 as shown in FIG. 5, the first lamination cycle is initiated by closing laminator platens 42, 44, preferably applying little or no ram pressure to book 35. This is preferably done using hydraulic pressure, and a pressure not to exceed about 10 pounds per square inch is believed sufficient for most applications.

A laminator heat cycle is initiated, bringing the temperature of platens 42,44 up to a range of 275° F. to 400° F., and most preferably up to a range of 300° F. to 370° F. for a period of ranging between 1 to 20 minutes, but preferably greater than 5 minutes, and most preferably in the range of 7 to 10 minutes for PVC material. It must be understood that the temperatures recited herein are by means of example. The use of thermoplastic material other than PVC or the presence of pigments in the core material may require modification of the heat cycle temperature.

Once the heat cycle has been applied to book 35 as is set forth above, the ram pressure of laminator 40 is increased to facilitate the flow of the plastic core sheets 30, 32 so that the one or more electronic elements 20 become encapsulated thereby, and so that sheets 30, 32 form a uniform core 33 with upper and lower surfaces 34,35. The ram pressure translates into an effective pressure on core 33 in the range of 200 to 450 psi and preferably in the range of 250 to 350 psi. As can be expected temperature and pressure are inversely related to one another. In other words a lamination cycle at a higher temperature will require less pressure to be applied to core 33, and conversely a lower temperature heat cycle will require increased ram pressure. Damage to the electronic components can result from excessive ram pressure on the core while insufficient ram pressure will likely cause an inadequate flow of the plastic resulting in air pockets or an irregular card surface.

As mentioned, the use of matte finished laminator plates 50,52 provides surfaces 34,35 with a slightly roughened or textured quality which will facilitate the application of a coating thereto as is discussed below. The ram pressure applied during the heat cycle and the length of the heat cycle may vary, depending especially upon the size of sheets 30, 32. For example, the cycle time may be in the range of 10–15 minutes. In one example, at a temperature of approximately 320 degrees Fahrenheit, a ram pressure of 940.135 pounds per square inch (p.s.i.), producing a pressure of about 275 psi at the core 33 surface, was applied for 10–15 minutes to form a uniform core 33, using sheets 30,32 of a size in the range of 12 inches by 24 inches to 24 inches by 36 inches.

Subsequent to the above heat cycle, laminator 40 applies a chill cycle to book 35 during which time the ram pressure of the laminator 40 is increased, preferably by approximately 10–40% and most preferably about 25% until the platens 42,44 have cooled so as to return the core material to a solid state. In the preferred method the platens 42, 44 are cooled to approximately 40° F. to 65° F. for approximately 10–15 minutes. Core 33 may then be removed from laminator 40 for additional processing.

Figure 6:
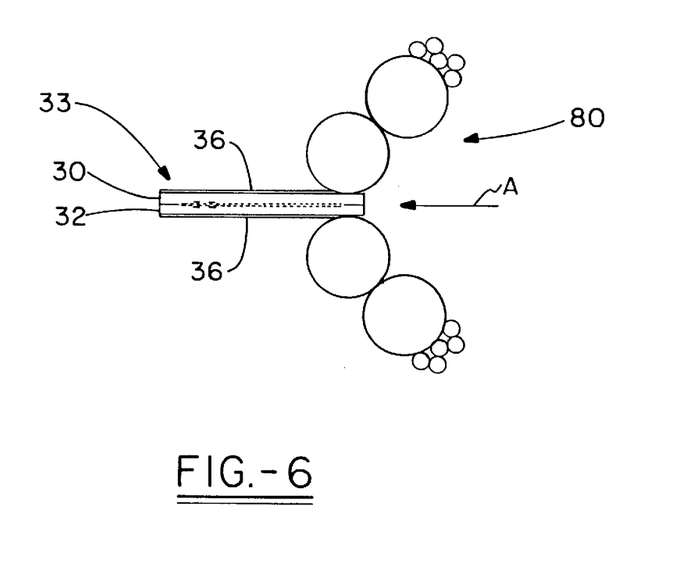
FIG. 6 schematically illustrates the process of printing on the core.

Subsequent to the removal of core 33 from laminator 40, and as illustrated in FIG. 6, core 33 is coated on at least one of its upper and lower surfaces 34, 35 with a layer of printing ink 36. This may be accomplished using a wide variety of printing techniques such as offset printing, letterpress printing, screen printing, roller coating, spray printing, litho-printing, and other suitable printing techniques. As shown in FIG. 6, core 33 is fed in the direction indicated with arrow A through a printing press, a lithographic printer, or a similar apparatus 80. This printing step is performed to coat at least one surface 34, 35 of core 33 with a layer of aesthetically pleasing ink 36. This layer of ink 36 can also serve to cosmetically hide the one or more electronic elements 20 that are embedded within core 33, and prevent these one or more electronic elements 20 from showing through the relatively thin core 33. In this manner, the one or more electronic elements 20 encapsulated in core 33 are completely hidden from view without requiring the plastic used in the manufacture core 33 to be excessively thick (exceeding ISO standards for cards of this type).

Figure 7:
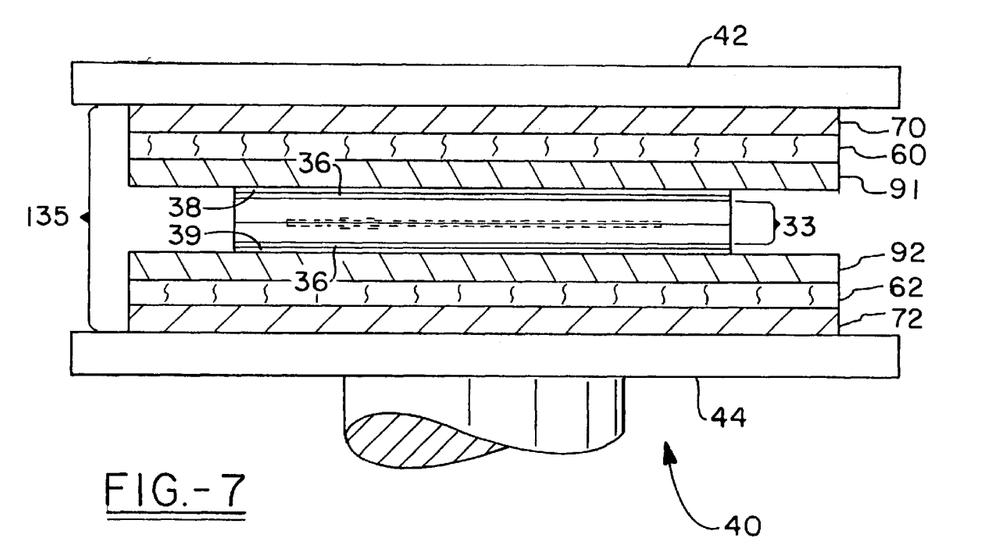
FIG. 7 is a schematic cross sectional view illustrating the core with overlaminate film, as placed in a laminator.

Referring now to FIG. 7, the final preferred, but optional processing of core 33, which now comprises a layer of ink 36 or the like on at least one surface 34,35 thereof, is schematically illustrated. An overlaminate layer such as clear overlaminate film 38 is positioned on at least one ink coated surface 34,35 of core 33, and preferably core 33 is positioned between two similar sheets of overlaminate film 38,39 as shown. Overlaminate film is very thin, for example in the range of 0.0015" thick. A book 135 is then constructed for insertion into laminator 40 as is schematically illustrated in FIG. 7. Book 135 comprising core 33, including at least one layer of ink 36 and at least one layer of overlaminate film 38, 39 is positioned between laminating plates which are preferably highly polished plates such as mirror finished stainless steel plates 91, 92. Book 135 also comprises first and second laminating pads 60, 62 and first and second steel plates 70, 72 as is discussed above in relation to FIG. 7.

When book 135 is positioned between upper and lower platens 42,44 of laminator 40 as shown in FIG. 7, the laminator is closed and a heat cycle in the range of 175° F. to 300° F., and most preferably in the range of 180° F. to 275° F., is applied to book 135 for a period of 10 to 25 minutes to produce a pressure on book 135 of between 200 to 450 psi, preferably 250–350 psi, with a ram pressure that varies depending upon sheet size or the ram size of the laminator 40, but which is typically approximately 1000 p.s.i. with an 18 inch diameter ram. This step causes the overlaminate layer 38 to flow in order to produce a uniform protective layer over the printing.

The laminator 40 is then caused to execute a chill cycle, preferably with a corresponding increase in ram pressure. For example, the chill temperature may be in the range of 40° F. to 65° F. and last for a period of 10 to 25 minutes. However, any combination of temperature and time which permits the re-solidification of the overlaminate layer 38 may be used. A ram pressure increase of approximately 10 to 40% over the pressure used for the heat cycle has been found to be preferable, with a pressure increase of approximately 25% being most desirable.

It is important to note that the use of pressure, or more significantly temperature, in the second lamination cycle should only affect the overlaminate layer 38 and should not cause softening or re-flow of plastic core 33. In lieu, of this preferred overlamination process, it is to be understood that colorfast inks may not require an overlaminate layer or that alternative overlaminates such as those applied by spray, silk screening or roll on may be used.

Subsequent to the above described second lamination cycle, a sheet of plastic card stock is provided which comprises at least core 33 with at least one surface 34,35 thereof covered by a layer of ink 36, and with at least one surface 34,35 thereof covered by a layer of overlaminate film 38, 39.

Figure 8:
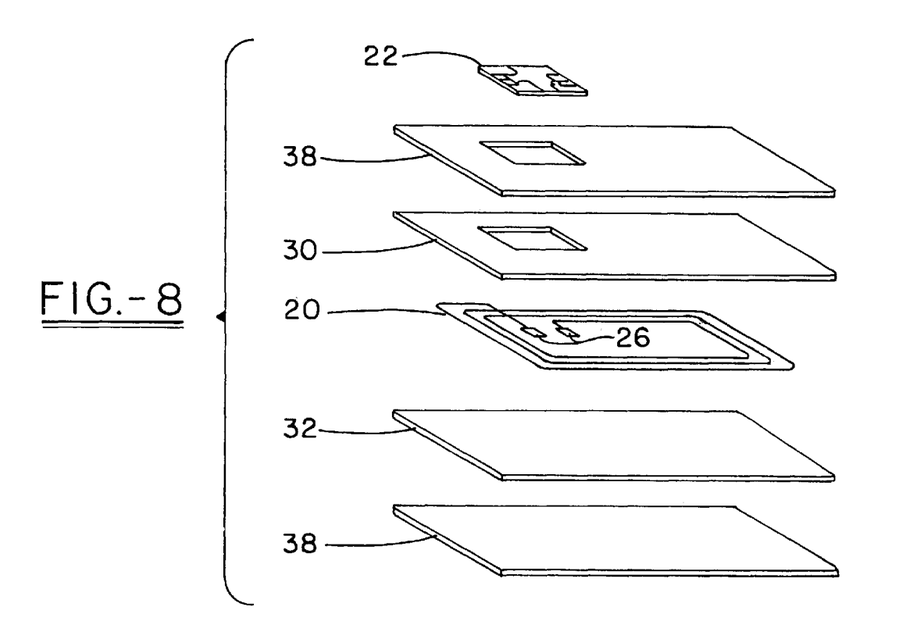
FIG. 8 is an exploded view of a plastic card produced by the process of the present invention.

Preferably plastic card stock manufactured in accordance with the present invention comprises core 33 covered on both surfaces 34,35 with a layer of ink 36 which is positioned between layers of overlaminate film 38,39, all of which has been laminated together as described and as shown in FIG. 8. One or more cards 10 then may be cut from the resulting plastic card stock and card 10 will have a thickness in the range of 0.028 inches to 0.032 inches with variation in overall thickness across the surfaces 12, 14 thereof being no greater than approximately 0.0005 inches. The one or more cards 10 can thus be said to have a glossy surface smoothness of approximately 0.0005 inches or better. Thus, a card 10 manufactured in accordance with the present invention includes at least one surface 12,14 at preferably both surfaces 12,14 that are sufficiently smooth, glossy and regular to receive dye sublimation printing.

In the preferred embodiment, each card 10 undergoes a controlled-depth milling operation to form a window or cavity 16 and to expose one or more of the contact pads 26 connected to the antenna 24. Thereafter, a microprocessor chip 22 having a contact surface is inserted into the cavity and in electronic contact with contact pads 26. Chip 22 may be attached to contact pads 26 by known means such as conductive adhesives (including those cured by UV or sonic energy) or low temperature solder. The overall thickness of the card including the area occupied by chip 22 meets ISO standards and is capable of operation in compatible physical readers.

In an alternative embodiment, a cavity or window 16 is formed in the first or second sheet of plastic core stock, prior to the first lamination step. The core stock is positioned over the electronic element, generally 20, to expose one or more contact pads 26. This may also be done using electronic elements wherein microprocessor chip 22 is already attached to contact pads 26 and/or antenna 24 in which case the cavity is positioned over and around chip 22. As shown in FIG. 5a, a spacer 90 is inserted into cavity 16 and over contact pads 26 or chip 22. The spacer 90 may be integral to one of the matte laminating plates 50, 52 or separate therefrom and made of any suitable non-stick material such as Teflon™ Spacer 90 is utilized to prevent or limit the flow of plastic into cavity 16 during the lamination process so as not to cover contact pads 26 or chip 22 with plastic. When spacer 90 is non-integral with matte laminating plate 50 or 52 it may be removed or cut-away after either the lamination or overlamination process to expose cavity 16 and allow microchip 22 to be inserted therein and retained by such means as are known in the art, including solder or adhesives. In this embodiment where the chip is installed prior to lamination, when viewed in cross-section the outer surface of chip 22 is below the upper surface 34 or core sheet 35 prior to lamination, thus core sheets will accept the majority of applied pressure from the laminator. Spacer 90 provides further protection. As the core material softens, the plastic will flow around spacer 90 and chip 22 and the distance between the outer surface of chip 22 and the upper surface of core sheet 35 will decrease.

Those skilled in the art will recognize that the foregoing description has set forth the preferred embodiment of the invention in particular detail and it must be understood that numerous modifications, substitutions, and changes may be undertaken without departing from the true spirit and scope of the present invention as defined by the ensuing claims.

What is claimed is:

1. A process for incorporating at least one electronic element in the manufacture of a plastic card, comprising the steps of:
   (a) providing first and second plastic core sheets;
   (b) positioning said at least one electronic element in the absence of a non-electronic carrier directly between said first and second plastic core sheets to form a core, said plastic core sheets defining a pair of inner and outer surfaces of said core;
   (c) positioning said core in a laminator apparatus, and subjecting said core to a heat and pressure cycle; said heat and pressure cycle comprising the steps of:
      (i) heating said core for a first period of time;
      (ii) applying a first pressure to said core for a second period of time such that said at least one electronic element is encapsulated by said core;
      (iii) cooling said core while applying a second pressure to said core;

(d) coating at least one of said outer surfaces of said core with a layer of ink;

(e) milling a region of said core to a controlled depth so as to form a cavity which exposes at least one contact pad of said electronic element.

2. The process for incorporating at least one electronic element in the manufacture of a plastic card as recited in claim 1, wherein said laminator apparatus has first and second laminating plates, at least one of said first and second laminating plates having a matte finish for creating a textured surface on at least one of said outer surfaces of said core.

3. The process for incorporating at least one electronic element in the manufacture of a plastic card as recited in claim 2, wherein each of said first and second laminating plates has a matte finish for creating said textured surface on both of said outer surfaces of said core.

4. The process for incorporating at least one electronic element in the manufacture of a plastic card as recited in claim 1, wherein said first and second plastic core sheets are made from a material selected from the group consisting of polyvinyl chloride, polyester, and acrylonitrile-butadiene-styrene, each of said sheets having a thickness in the range of 0.007 to 0.024 inch.

5. The process for incorporating at least one electronic element in the manufacture of a plastic card as recited in claim 5, wherein said first and second plastic core sheets have a thickness of approximately 0.0125 inch.

6. The process for incorporating at least one electronic element in the manufacture of a plastic card as recited in claim 1, wherein said second pressure is greater than said first pressure.

7. The process for incorporating at least one electronic element in the manufacture of a plastic card as recited in claim 6, wherein said second pressure ranges from about 10% to about 40% greater than said first pressure.

8. A hot lamination process as recited in claim 1 having a further step following step (d), said step comprising: positioning said core in a laminator apparatus with a layer of overlaminate film on at least one of said upper and lower surfaces of said core and laminating said layer of overlaminate film to said core in said laminator to thereby form a sheet of plastic card stock.

9. The process for incorporating at least one electronic element in the manufacture of a plastic card as recited in claim 1, wherein said core is heated in step (c)(i) to a temperature in the range of 275° F. to 400° F. and said first period of time is at least five (5) minutes.

10. The process for incorporating at least one electronic element in the manufacture of a plastic card as recited in claim 1, wherein said first pressure is approximately 450 p.s.i. and said second period of time is at least 10 minutes.

11. The process for incorporating at least one electronic element in the manufacture of a plastic card as recited in claim 1, wherein said step (d) is carried out utilizing a printing press.

12. The process for incorporating at least one electronic element in the manufacture of a plastic card as recited in claim 1, wherein said step (d) is carried out utilizing a coating technique selected form the group consisting of silk screen printing, offset printing, letterpress printing, screen printing, roller coating, spray printing and litho-printing.

13. The process for incorporating at least one electronic element in the manufacture of a plastic card as recited in claim 1, wherein said step (e) of applying a layer of overlaminate film comprises the further steps of:

(a) positioning an overlaminate film on at least one ink coated surface of said core;

(b) subjecting said core to a second heat and pressure cycle comprising the steps of:
  (i) heating said core to a temperature between approximately 175° F. to 300° F. for approximately 10 to 25 minutes;
  (ii) applying approximately 1000 p.s.i. pressure to said core; and
  (iii) cooling said core to a temperature in the range of approximately 40° F. to 65° F. for approximately 10 to 25 minutes.

14. A hot lamination process is recited in claim 1 comprising the further step of inserting an electronic contact element into said cavity.

15. The process for incorporating at least one electronic element in the manufacture of a plastic card as recited in claim 1, wherein said at least one electronic element is a micro-chip and an associated circuit board antenna or an associated wire antenna.

16. The process for incorporating at least one electronic element in the manufacture of a plastic card as recited in claim 1, wherein said at least one electronic element is a read/write integrated chip and an associated antenna.

17. A process for incorporating at least one electronic element having at least one electronic subcomponent in the manufacture of a plastic card, comprising the steps of:

(a) providing first and second plastic core sheets, at least one core sheet having a cavity formed therein;

(b) positioning said at least one electronic element in the absence of a non-electronic carrier between said first and second plastic core sheets to form a layered core, said plastic core sheets defining a pair of inner and outer surface of said core, and said cavity positioned so as to expose said at least one electronic subcomponent therein;

(c) inserting a spacer into said cavity, said spacer substantially filling said cavity and covering said at least one electronic subcomponent;

(d) positioning said core in a laminator apparatus, and subjecting said core to a heat and pressure cycle, said heat and pressure cycle comprising the steps of:
  (i) heating said core for a first period of time;
  (ii) applying a first pressure to said core for a second period of time such that said at least one electronic element is encapsulated by said core;
  (iii) cooling said core while applying a second pressure to said core;

(e) coating at least one of said outer surfaces of said core with a layer of ink;

(f) removing said spacer from the cavity of said core.

18. A hot lamination process as recited in claim 17, wherein said electronic sub-component comprises one or more elements from the group consisting of a micropressor chip, a contact pad, a transponder and a contact sensor.

* * * * *

UNITED STATES PATENT AND TRADEMARK OFFICE
CERTIFICATE OF CORRECTION

PATENT NO.    : 6,036,099
DATED         : March 14, 2000
INVENTOR(S)   : Keith R. Leighton It is certified that error appears in the above-identified patent and that said Letters Patent is hereby corrected as shown below:

<u>Column 1,</u>
Line 7, replace "Oct. 7, 1996" with -- Oct. 7, 1996, which claimed the benefit of provisional application serial no 60/005,685, filed on October 17, 1995, filed on October 17, 1995. This application claims the benefit of provisional application serial no. 60/024,255, filed August 21, 1996 --.

Signed and Sealed this

Twenty-fourth Day of September, 2002

*Attest:*

*Attesting Officer*

JAMES E. ROGAN
*Director of the United States Patent and Trademark Office*